(12) United States Patent
Takanashi

(10) Patent No.: US 8,230,308 B2
(45) Date of Patent: Jul. 24, 2012

(54) DECODING APPARATUS AND DECODING METHOD USING AN ADDITIONAL ADD-COMPARE-SELECT OPERATION ON DECODED DATA IN THE EVENT OF AN ERROR IN THE DECODED DATA

(75) Inventor: Mitsunori Takanashi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 882 days.

(21) Appl. No.: 12/342,595

(22) Filed: Dec. 23, 2008

(65) Prior Publication Data

US 2009/0172503 A1 Jul. 2, 2009

(30) Foreign Application Priority Data

Dec. 27, 2007 (JP) ................................. 2007-337548

(51) Int. Cl.
*G06F 11/00* (2006.01)
(52) U.S. Cl. ...................................................... 714/792
(58) Field of Classification Search ................... 714/792, 714/794–796; 375/262, 265, 341
See application file for complete search history.

(56) References Cited

U.S. PATENT DOCUMENTS

| | | | |
|---|---|---|---|
| 5,349,589 A | | 9/1994 | Chennakeshu et al. |
| 5,887,007 A | * | 3/1999 | Iwata et al. ................... 714/795 |
| 6,094,465 A | * | 7/2000 | Stein et al. ...................... 375/346 |
| 6,304,612 B1 | * | 10/2001 | Baggen et al. ................. 375/262 |
| 6,885,701 B2 | * | 4/2005 | Kuwazoe ....................... 375/225 |
| 7,228,491 B2 | * | 6/2007 | Oki ................................ 714/794 |
| 2005/0053040 A1 | * | 3/2005 | Choi et al. ..................... 370/335 |

FOREIGN PATENT DOCUMENTS

JP 09-232971 9/1997

OTHER PUBLICATIONS

Korean Official Action—2008-0133577—Nov. 24, 2010.
Howard H. Ma et al., On Tail Bitting Convolutionalnal Codes, IEEE Transactions on Communications, vol. COM-34, No. 2, Feb. 1986.
Extended European Search Report dated Feb. 20, 2012, Application No. 08021681.5.
Yukihiko Okumura and Fumiyuki Adachi, Variable-Rate Data Transmission with Blind Rate Detection for Coherent DS-CDMA Mobile Radio, IEICE Transactions on Communications, Commuincations Society, Tokyo, JP, vol. E81-B, No. 7, Jul. 1, 1998, pp. 1365-1372, XP000790169.
Rose Y. Shao et al., Two Decoding Algorithms for Tailbiting Codes, IEEE Transactions on Communications, IEEE Service Center, Piscataway, NJ, USA, vol. 51, No. 10, Oct. 1, 2003, pp. 1658-1665, XP001186845.

* cited by examiner

*Primary Examiner* — Scott Baderman
*Assistant Examiner* — Joseph Kudirka
(74) *Attorney, Agent, or Firm* — Young & Thompson

(57) ABSTRACT

The decoding apparatus includes an ACS unit to execute an add-compare-select operation on encoded received data, and an error detector to detect whether there is an error in decoded data calculated based on the executed add-compare-select operation, and if there is an error in the decoded data, the ACS unit additionally executes the add-compare-select operation on the received data.

10 Claims, 9 Drawing Sheets

| input | 1(first) | 0 | 0 | 1 | 0 | 0 | 1(last) |
|---|---|---|---|---|---|---|---|
| output0, output1 | 0, 1 | 0, 1 | 1, 1 | 1, 1 | 1, 0 | 1, 1 | 1, 1 |

DECODING APPARATUS AND DECODING METHOD USING AN ADDITIONAL ADD-COMPARE-SELECT OPERATION ON DECODED DATA IN THE EVENT OF AN ERROR IN THE DECODED DATA

BACKGROUND

1. Field of the Invention

The present invention relates to a decoding apparatus and a decoding method and, particularly, to a decoding apparatus and a decoding method that perform decoding of tail-biting convolutional coded data using the Viterbi algorithm.

2. Description of Related Art

In a radio communication system such as a mobile communication system, communication is performed using data that is encoded in order to improve the error correction capability of data communicated by a radio signal. Convolutional coding is often used as an encoding technique. There are two types of convolutional coding: terminating convolutional coding and tail-biting convolutional coding.

The terminating convolutional coding generates encoded data by setting a termination bit having a predetermined value to the initial state of an encoder and at the end of a data row to be transmitted. Further, because the value of the initial state of the encoder is known in a decoder, the decoder performs decoding using the value of the initial state of the encoder as the initial state of the decoder at the start of decoding.

On the other hand, the tail-biting convolutional coding performs encoding and decoding of data without using the termination bit. The tail-biting technique performs encoding by setting the final K-1 (K is a constraint length) of a data row to be encoded as the initial value of an encoder. Thus, when data encoded by the tail-biting technique is decoded, the initial state and the final state of a decoder that performs the decoding are the same. Therefore, the decoder that decodes the data encoded by the tail-biting technique starts decoding processing with the initial state unknown, and determines the stop condition of the decoding processing with use of the characteristics of the data that the initial state and the end state are the same. The detail of the tail-biting decoding is disclosed in "On Tail Biting Convolutional Codes", Howard H. Ma et al., IEEE Transactions on Communications, Vol. COM-34, No. 2, February, 1986. Further, a Viterbi decoding method and a Viterbi decoding circuit for decoding data that is encoded by the tail-biting technique are disclosed in U.S. Pat. No. 5,887,007 (Iwata et al.).

The Viterbi decoding method taught by Iwata et al. is described hereinafter. The Viterbi decoding circuit taught by Iwata et al. performs decoding by executing an add-compare-select (ACS) operation on received encoded data. The ACS operation calculates a path in the maximum likelihood state of a path trace indicating a state transition from the start state to the final state of decoded data that is obtained by decoding the encoded data. The maximum likelihood state is the state transition of decoded data that is most likely (i.e. that has the highest likelihood) to the state transition of an encoder when encoding data before encoding by the encoder.

FIG. 10 is a flowchart showing the Viterbi decoding method disclosed in Iwata et al. Referring to FIG. 10, the Viterbi decoding method taught by Iwata et al. first executes the ACS operation repeatedly to select a path at each time and update a path metric (Steps S101 and S102) Each time performing the ACS operation, information about which of paths that reach each state has been selected (path selection signal) is stored into a path memory When the repetitive execution of the ACS operation ends on all the received bit rows, a maximum likelihood state Ss having a path metric with the highest likelihood at that time is detected (Step S103). By setting the maximum likelihood state Ss as the start state, path traceback is performed based on the path selection signal stored in the path memory to calculate a decoded bit from the state of each time that is traced back, thereby obtaining a decoded bit row A (Step S104). Further, a state Sr that is reached at the end of the traceback is detected (S105). After that, error check of the decoded bit row A is performed to determine whether there is an error in the decoded bit row A (Steps S106 and S107).

If the determination result shows that there is an error in the decoded bit row A, the maximum likelihood state Ss and the state Sr that is reached by the traceback are compared (Step S108). If the states Ss and Sr match, the process proceeds to Step S111, which is described later. If, on the other hand, the states Ss and Sr do not match, the state Sr is set as the start state, and path traceback is performed based on the path selection signal stored in the path memory to calculate a decoded bit from the state of each time that is traced back, thereby obtaining a decoded bit row B (Step S109). After that, error check of the decoded bit row B is performed to determine whether there is an error IN the decoded bit row B (Step S110).

On the other hand, if the determination result of Step S107 shows that there is no error in the decoded bit row A, if the determination result of Step S108 shows that the maximum likelihood state Ss and the trace finally reached state Sr match, or if error check on the decoded bit row B is completed, it is decided whether or not to use the obtained decoded bit row A or B as an output bit row, whether to use the obtained decoded bit row A or B after error correction, and so on, and then the output bit row is sent out (Step S111). For example, if there is no error in the decoded bit row A, the decoded bit row A may be used as the output bit row. If there is an error in the decoded bit row A and there is no error in the decoded bit row B, the decoded bit row B may be used as the output bit row. If there is an error in both of the decoded bit rows A and B, the output bit row may be decided according to a prescribed rule.

FIG. 11 is a state transition diagram to describe a specific example of the path traceback according to the Viterbi decoding method disclosed in Iwata et al. In the example of FIG. 11, it is assumed that an incorrect state 2 is selected as the maximum likelihood state, which is the state at the final time. In such a case, the Viterbi decoding method taught by Iwata et al. executes the path traceback of Step S104 starting from the state 2. In the traceback from the state 2, (10), a decoded bit "1" is obtained. Because the decoded bit (input bit) is "1" and a transition is made to the state $2_i$, the state at the previous time t=6, is the state 1, (01). Thus, a higher order bit "0" of the $2_i$ bits that define the state is obtained as the next decoded bit.

Subsequently, decoded bits are obtained one after another in the same way, and when it is traced back to the time t=0, a decoded bit row "1011010" (arranged in the order of traceback) is obtained. If error check is executed on the decoded bit row "0101101" that is obtained as a result of performing the path traceback by setting the state $2_i$, which is not the correct state, as the maximum likelihood state, a result shows that there is an error (Steps S106, S107).

Therefore, the path traceback is executed by setting the finally reached state in the first path traceback (Step S104), which is the state 0 in this case, to the state of the final time t=7 (Step S109). Because the start state of the path traceback is the state 0, (00), "0" is obtained as the decoded bit. Further, because the state of the time t=7, is the state 0, and the bit (decoded bit) that makes a transition to the state 0, is "0", the state at the time t=6, is the state 1, (01). Thus, "0" is obtained as the next decoded bit. Subsequently, decoded bits are obtained one after another in the same way, and when it is traced back to the time t=0, a decoded bit row "0011010" (arranged in the order of traceback) is obtained. If the order of the decoded bit row is returned to its original order, a decoded bit row that is the same as an input bit row to the encoder is obtained.

In this manner, the Viterbi decoding method taught by Iwata et al. executes path trace by setting the finally reached state as the start state when there is an error in a decoded signal obtained by path trace from a given state and the finally reached state and the start state of the path trace are different, and decides a finally output decoded signal by including the decoded signal obtained by the execution as a candidate. It is thereby possible to improve the accuracy (error rate) of the finally output decoded signal while preventing an increase in processing time and complication of the structure.

However, the present inventors have found a problem that, although the Viterbi decoding method taught by Iwata et al. performs additional traceback on a different path when a decoding result obtained by traceback on a maximum likelihood path is erroneous, it ends decoding if a decoding result obtained by the additional traceback is also erroneous, thus having low error correction capability.

SUMMARY

One aspect of an embodiment of the present invention is a decoding apparatus including an ACS unit to execute an add-compare-select operation on encoded received data, and an error detector to detect whether there is an error in decoded data calculated based on the executed add-compare-select operation, wherein if there is an error in the decoded data, the ACS unit additionally executes the add-compare-select operation on the received data.

Another aspect of an embodiment of the present invention is a decoding method including, if there is an error in decoded data calculated based on an add-compare-select operation executed on encoded received data, additionally executing the add-compare-select operation on the received data.

The decoding apparatus and the decoding method according to the exemplary embodiment can improve the error correction capability.

BRIEF DESCRIPTION OF THE DRAWINGS

The above and other objects, advantages and features the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
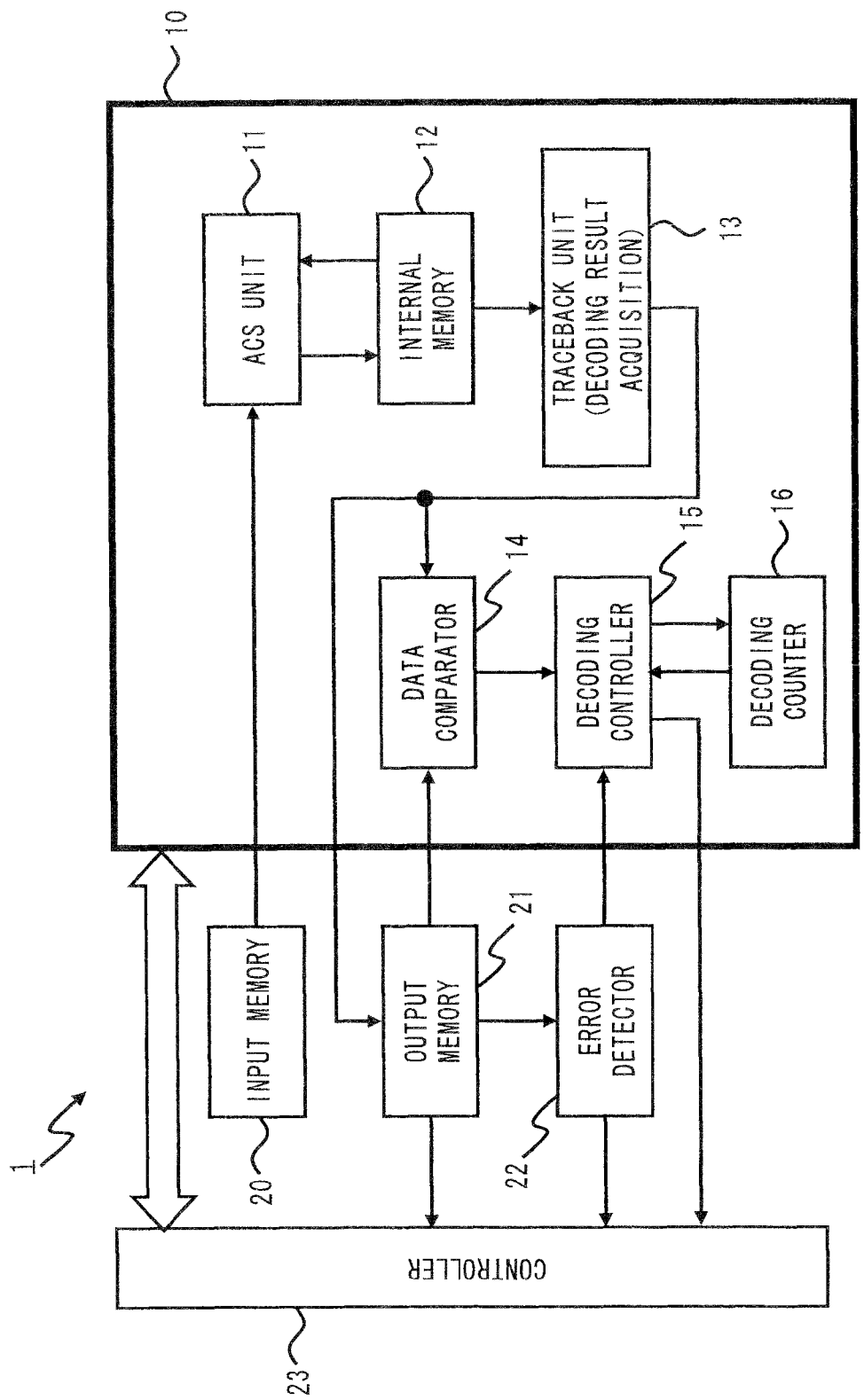
FIG. 1 is a block diagram showing a Viterbi decoding apparatus according to a first exemplary embodiment.
Figure 2:
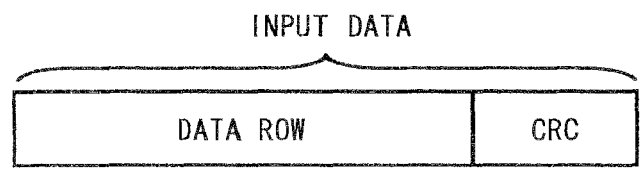
FIG. 2 is a conceptual diagram showing input data before encoding that is input to the Viterbi decoding apparatus according to the first exemplary embodiment.

An exemplary embodiment of the present invention is described hereinafter with reference to the drawings. FIG. 1 is a block diagram showing a Viterbi decoding apparatus 1 according to the exemplary embodiment. Referring to FIG. 1, the Viterbi decoding apparatus 1 includes a decoder 10, an input memory 20, an output memory 21, an error detector 22, and a controller 23. In the followings, a case where the Viterbi decoding apparatus 1 receives data that has been encoded based on the convolutional coding algorithm by an encoder at the transmitting end and decodes the input data based on the Viterbi decoding algorithm is described. Further, the input data received by the Viterbi decoding apparatus 1 contains an encoded error detecting code (e.g. a cyclic redundancy check (CRC) code) added to a data row to be transmitted. FIG. 2 is a conceptual diagram showing the data before encoding that is used in the exemplary embodiment.

The decoder 10 includes an ACS unit 11, an internal memory 12, a traceback unit 13, a data comparator 14, a decoding controller 15, and a decoding counter 16. The ACS unit 11 performs decoding of input data by reproducing the state transition of an encoder in encoding processing at the transmitting end based on the input data that is read from the input memory 20. Specifically, the ACS unit 11 holds transition paths that reach all the states at a given time point as candidate paths and selects the most likely transition path (maximum likelihood selection) as the state transition of the encoder at the transmitting end with use of the input data, thereby performing decoding by estimating the state transition of the encoder. The likelihood is used as a specific indicator of the degree of likeliness. Further, in this exemplary embodiment, the tail-biting Viterbi decoding algorithm is used as a decoding method. The add-compare-select (ACS) operation is used as a decoding operation in the ACS unit 11.

The ACS operation is described hereinafter. When executing the Viterbi decoding, a path metric indicating the likelihood of a path is obtained by adding up a branch metric indicating the likelihood of a transition from a certain state to another state in a trellis diagram at every path on the trellis diagram. As obvious from the state transition of a shift register that constitutes a convolutional encoder, the number of transition branches that reach each state at each time point in the trellis diagram is two. Accordingly, the number of paths that reach each state belonging to each time point of the trellis diagram is also two The path metric can be obtained by adding up the branch metrics of the respective branches which form the path that reaches a certain state at a certain time point. The number of paths that reach each state in the trellis diagram is two as described above. The Viterbi decoding algorithm compares the path metrics of the two paths that reach a certain state and selects the path with the higher likelihood as a survival path (the relationship between the value of the path metric and the likelihood changes depending on the way of defining the path metric). The other path is discarded, determining that it is not the path that is likely to reach the state. Specifically, the Viterbi decoding algorithm adds the branch metrics, compares the calculated path metrics in each state, and selects one survival path in each state. This is called the ACS operation. The Viterbi decoding algorithm repeats the ACS operation from the initial time point to the final time point in the trellis diagram. Then, it compares the path metrics in each state belonging to the final point in the trellis diagram and selects one state with the maximum likelihood. Then, the decoded data is acquired based on the path that reaches the selected one state (traceback). The ACS unit 11 is an operation part that executes the ACS operation.

The internal memory 12 stores path information (e.g. path likelihood information, survival path information etc.) in the ACS unit 11. The traceback unit 13 generates decoded data to be finally used by referring to the path information stored in the internal memory 12. Specifically, the traceback unit 13 performs traceback processing. The traceback processing generates decoded data by retrieving data on the maximum likelihood path sequentially from the final state to the initial state of the maximum likelihood path. In sum, the decoder 10 generates decoded data by selecting decoded data candidates using the ACS unit 11 and decoding data using the traceback unit 13.

The data comparator 14 compares the decoded data in the current cycle that is output from the traceback unit 13 with the decoded data in the previous cycle that is stored in the output memory 21, and outputs a comparison result to the decoding controller 15. The decoding controller 15 determines whether to end the decoding processing performed in the decoder 10 based on the comparison result output from the data comparator 14, the error detection result output from the error detector 22, or the count value output from the decoding counter 16. Then, the decoding controller 15 outputs an end determination result to the controller 23. The decoding counter 16 counts the number of cycles of the ACS operation executed in the ACS unit 11 and outputs a count value.

The input memory 20 stores received data (which is referred to hereinafter as input data). The input data stored in the input memory 20 is data that is obtained by performing baseband processing on a radio signal received via an antenna, for example. The output memory 21 stores the decoded data that is output from the traceback unit 13 in each processing cycle of the decoder 10. The error detector 22 detects an error in the decoded data by comparing an error detecting code (e.g. a first CRC) contained in the decoded data with an error detecting code (e.g. a second CRC) generated from a data row in the decoded data, and outputs a detection result as an error detecting result. The controller 23 controls the operation of the decoder 10 based on the decoded data stored in the output memory 21, the error detecting result output from the error detector 22, and the end determination result output from the decoding controller 15.

Figure 3:
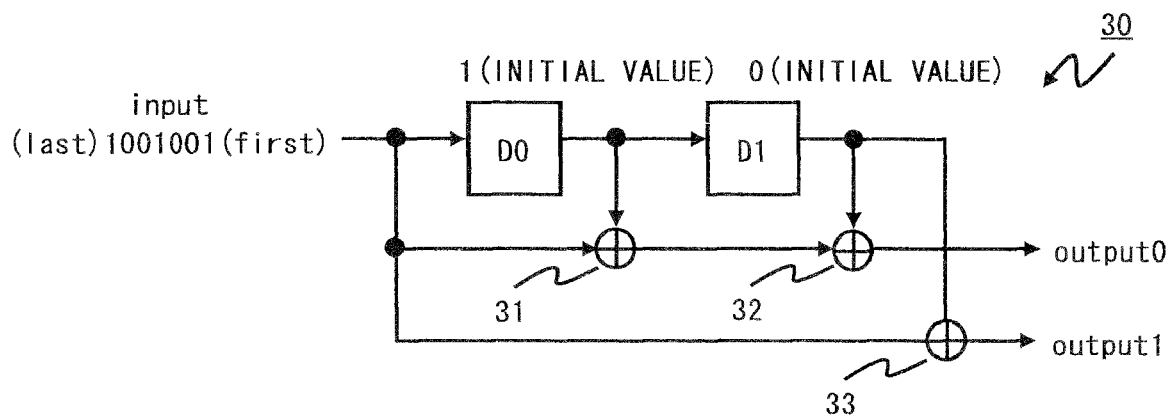
FIG. 3 is a block diagram showing an example of a convolutional encoder.

The processing of the tail-biting convolutional coding is described hereinbelow. FIG. 3 is a block diagram showing a convolutional encoder 30. The convolutional encoder 30 includes shift registers D0 and D1, and exclusive-OR circuits (XOR circuits) 31 to 33. Input data ("input" in FIG. 3) is input to the shift register D0. An output signal of the shift register D0 is input to the shift register D1. The input data and the output signal of the shift register D0 are input to the XOR circuit 31, and the XOR circuit 31 outputs an XOR of those inputs. The output signal of the XOR circuit 31 and the output signal of the shift register D1 are input to the XOR circuit 32, and the XOR circuit 32 outputs an XOR of those inputs as a first output signal ("output0" in FIG. 3). The input data and the output signal of the shift register D1 are input to the XOR circuit 33, and the XOR circuit 33 outputs an XOR of those inputs as a second output signal ("output1" in FIG. 3).

When performing the tail-biting encoding in the convolutional encoder 30, the final two bits of the input data are set as the initial state of the shift registers D0 and D1. Then, the input data is input after the initial value, thereby generating encoded data. The initial value is set before the start of encoding processing.

Figures 4, 5:
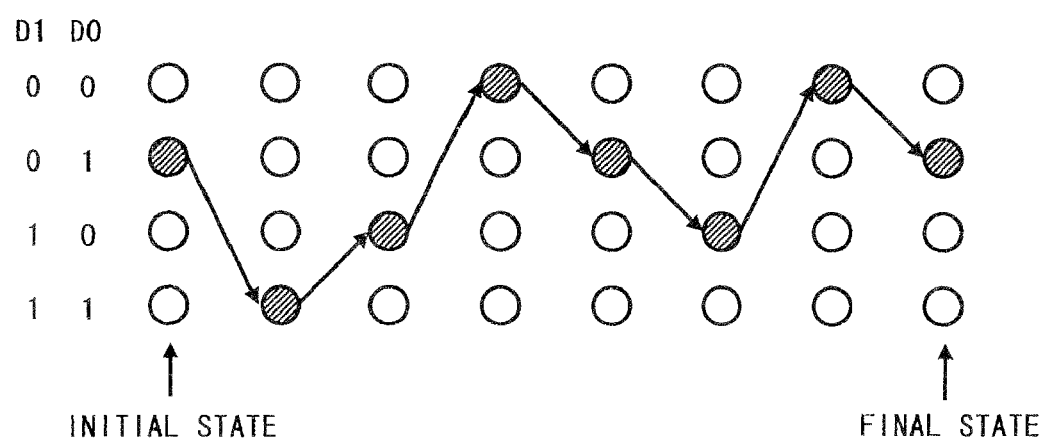
FIG. 4 is a table showing a relationship between input data and output data when performing tail-biting encoding in the convolutional encoder of FIG. 3.
FIG. 5 is a trellis diagram in the convolutional encoder of FIG. 3.

An example of encoding processing using the convolutional encoder 30 is described hereinafter with reference to the relationship between input data and output data shown in FIG. 4. In the example of FIG. 4, "1001001" is used as the input data. Thus, "1" is set as the initial value of the shift register D0 of the convolutional encoder 30, and "0" is set as the initial value of the shift register D1 of the convolutional encoder 30. Upon input of the first bit of the input data to the convolutional encoder 30, the encoding processing is started.

If the first bit "1" of the input data is input, the first output signal is "0", and the second output signal is "1". After that, the subsequent input data is input, and thereby "0011111" is output as the first output signal corresponding to the input data, and "1111011" is output as the second output signal. FIG. 5 shows a state transition diagram (which is referred to hereinafter as a trellis diagram) of the shift registers D0 and D1 in the encoding processing.

As shown in FIG. 5, the state of the shift registers D1 and D0 makes a transition from the initial state of (D1, D0)="01", then "11", "10", "00", "01", "10" and "00", to the final state of "01". In the tail-biting technique, the initial state and the final state are the same. Then, the decoder 10 performs decoding by estimating the state transition in the convolutional encoder 30 based on the received input data.

Figure 6:
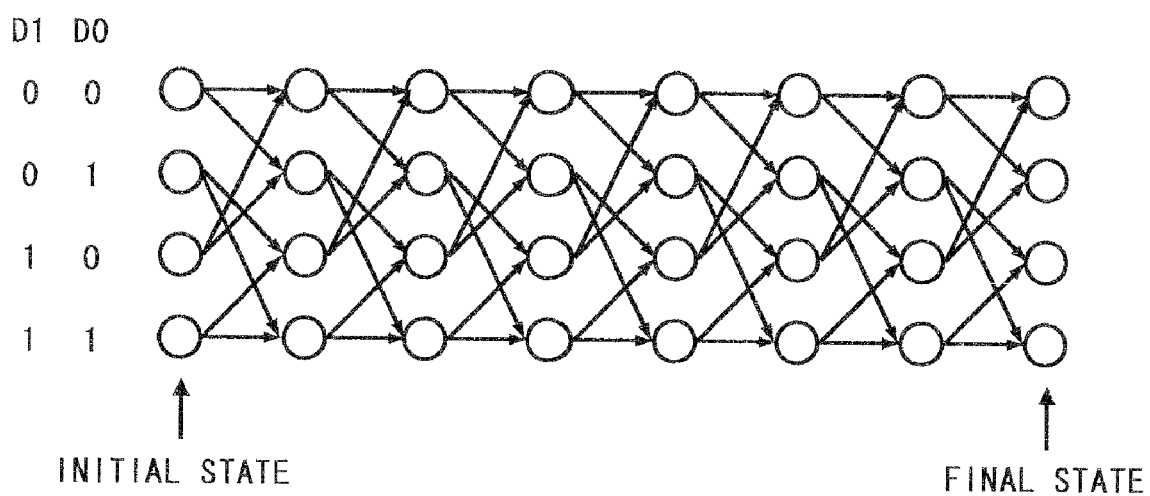
FIG. 6 is a trellis diagram in the Viterbi decoding apparatus according to the first exemplary embodiment.

The decoding processing in the decoder 10 is described hereinbelow. FIG. 6 is a trellis diagram showing the state which the decoder 10 can estimate based on the input data read from the input memory 20. The number of branches that make a transition to each state in the trellis diagram is two as shown in FIG. 6. In the tail-biting technique, the initial state and the final state are not determined in the trellis diagram. Thus, the Viterbi decoding apparatus 1 according to the exemplary embodiment repeatedly performs the ACS operation on the same input data, thereby selecting one maximum likelihood path.

The reason for performing the ACS operation repeatedly is as follows. In the Viterbi decoding, when performing the ACS operation, the initial value of the path metric is set for each state at the initial time point in the trellis diagram. In the case of conducting the terminating Viterbi decoding, for example, the initial state and the final state of the convolutional encoder at the data transmitting end are determined. In the convolutional encoder shown in FIG. 3, the initial state and the final state may be both (D1, D0)=(0, 0), for example. In such a case, the state transition in the trellis diagram is most likely to start from the state (D1, D0)=(0, 0), and the state transition in the trellis diagram is most likely to end with the state (D1, D0)=(0, 0). Thus, if the start state of the state transition in the trellis diagram is known as in the terminating technique, weights are assigned to the path metric of each state belonging to the initial time point in the trellis diagram.

For example, when using the Hamming distance between the received data and the data corresponding to the state transition is used for the math metric, the likelihood of the state is higher as the path metric is smaller. In the case of the above example, the likelihood in each state can be differentiated by setting the path metric of the state at the initial time point (D1, D0)=(0, 0) to 0, and setting the path metric of the other state at the initial time point to a value sufficiently larger than 0. Because the end state of the state transition is most likely to be the state at the final time point (D1, D0)=(0, 0), it is possible to enhance the decoding success rate by starting traceback for obtaining decoded data from the state belonging to the final time point (D1, D0)=(0, 0).

On the other hand, if the initial state of the state transition is not determined as in the tail-biting technique, weights cannot be assigned to the path metric as described above. In such a case, it is unknown from which of the states belonging to the initial time point in the trellis diagram the state transition starts. Thus, the identical path metric is given to the respective states without assigning weights to each path metric. For example, in the case of using the above-mentioned Hamming distance as the path metric, all the path metrics of the respective states belonging to the initial time point may be set to 0,, for example. Then, the ACS operation is performed once from the initial time point to the final time point in the trellis diagram The path metric of each state belonging to the final time point is thereby determined. Not all of the path metrics of the states belonging to the final time point are 0,, and the values differ in the respective states. Decoded data can be obtained by performing traceback from the most likely state. However, there may be an error in the obtained decoded data.

In this exemplary embodiment, if there is an error in the decoded data, the ACS operation is performed once again on the same received data by setting the path metric in each state at the final time point as the initial value. Then, the traceback is performed based on the ACS operation, so that a decoding result is obtained again. If the ACS operation is performed again, a result of the ACS operation is different from a result of the previous ACS operation because the path metric of each state at the initial time point is different from that when executing the ACS operation previously in spite that the received data is the same. This is the reason for performing the ACS operation repeatedly, and the ACS operation is performed again on the same received data with use of the information of the previous ACS operation in this exemplary embodiment. The error correction capability of the decoding apparatus can be improved by repeatedly executing the ACS operation.

Figure 7:
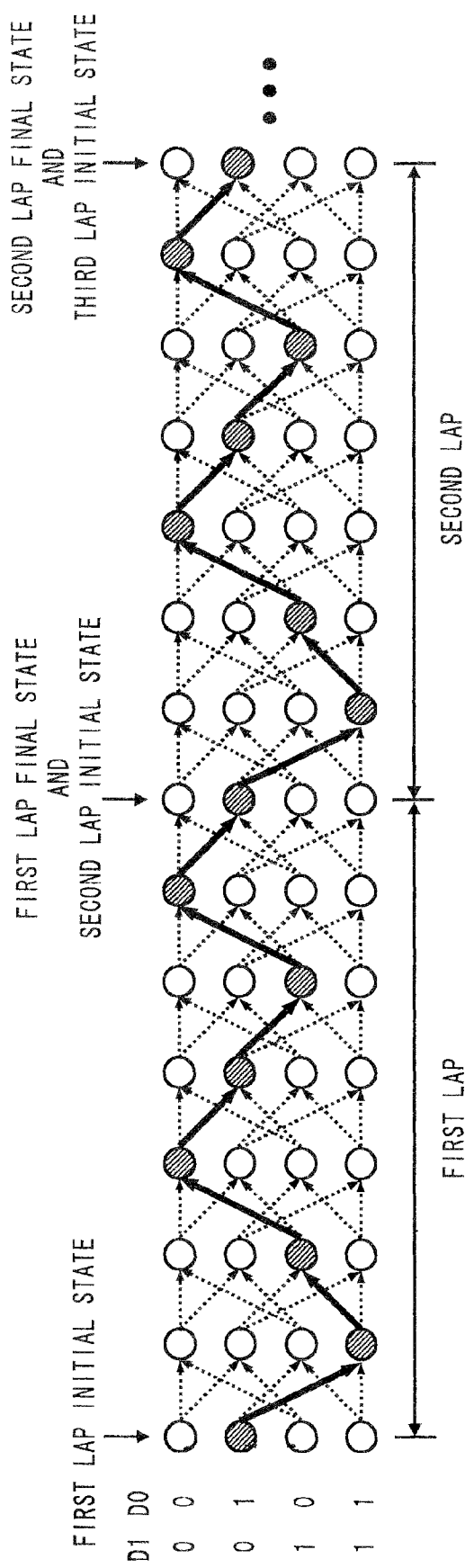
FIG. 7 is an example of a trellis diagram when using the data of FIG. 4 in the Viterbi decoding apparatus according to the first exemplary embodiment.

FIG. 7 is a trellis diagram in the case of performing two cycles of the ACS operation. In the following description, the cycles of the ACS operation are referred to as a first lap, a second lap and a third lap in the order of executing the processing. FIG. 7 shows the case of inputting the input data "input" shown in FIG. 4 when the initial state of the shift registers D1 and D0 obtained in the decoder 10 in the first lap is "01". As shown in FIG. 7, if "1001001" is input as the input data, the state transition obtained in the decoder 10 changes from the initial state of "01" sequentially in the order of "11","10", "00", "01", "10", "00", and "01" is obtained as the final state of the first lap.

Then, the same input data is input again by setting the final state of the first lap as the initial state of the second lap. Thus, by repeating the ACS operation, the ACS operation is performed in the second lap by setting the final bit of the input data as the initial state. In the example shown in FIG. 7, because the initial state and the final state in the first lap are the same, the state transition in the second lap is the same as that in the first lap.

Figure 8:
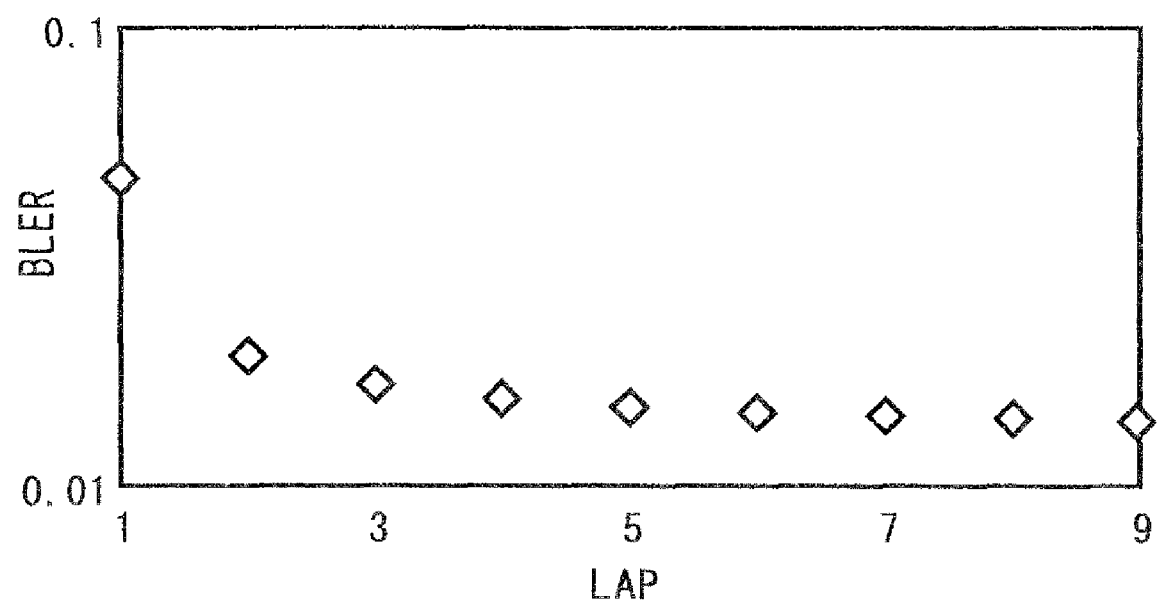
FIG. 8 is a graph showing a relationship between the number of repeated times of operation and an error rate in the Viterbi decoding apparatus according to the first exemplary embodiment.

In this manner, the tail-biting technique performs the ACS operation repeatedly on the same data so as to determine the initial state of the second time or later, thereby improving the error correction capability each time repeating the operation. FIG. 8 shows a relationship between the number of repeated times of operation (LAP) in the tail-biting decoding and an error rate of data (BLER). As shown in FIG. 8, in the tail-biting decoding, the error rate decreases significantly in the second-time operation compared with the first-time operation. Although the error rate decreases as the number of repeated times of operation increases in the second and subsequent times, a decrease in the error rate becomes substantially zero at the error rate of a certain level. In other words, if the number of repeated times of operation reaches a certain number, the error rate does not substantially change even if the operation is repeated after that. Thus, if an error is not corrected in spite of repeating the operation, the possibility of correcting an error is low even if the operation is continued after that.

Figure 9:
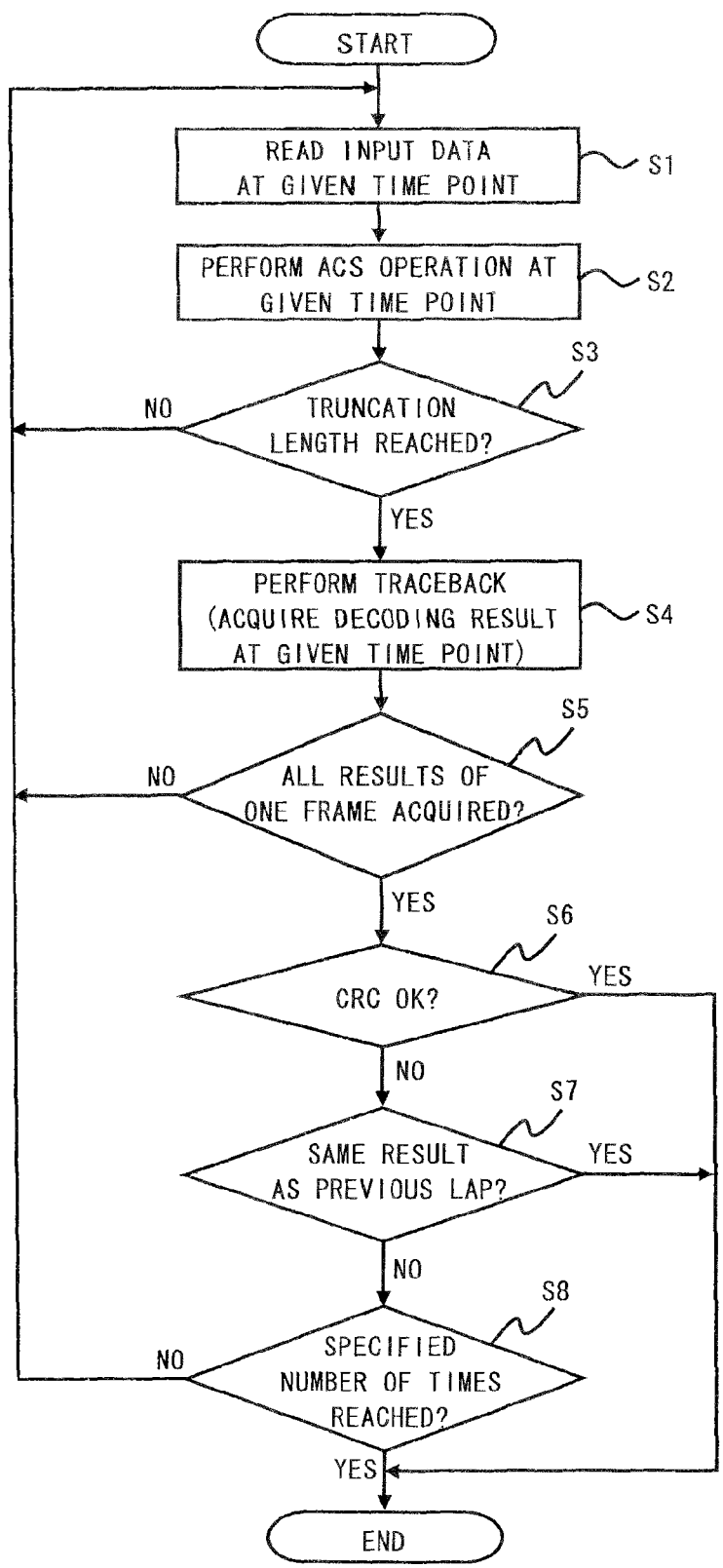
FIG. 9 is a flowchart of decoding processing in the Viterbi decoding apparatus according to the first exemplary embodiment.
Figure 10:
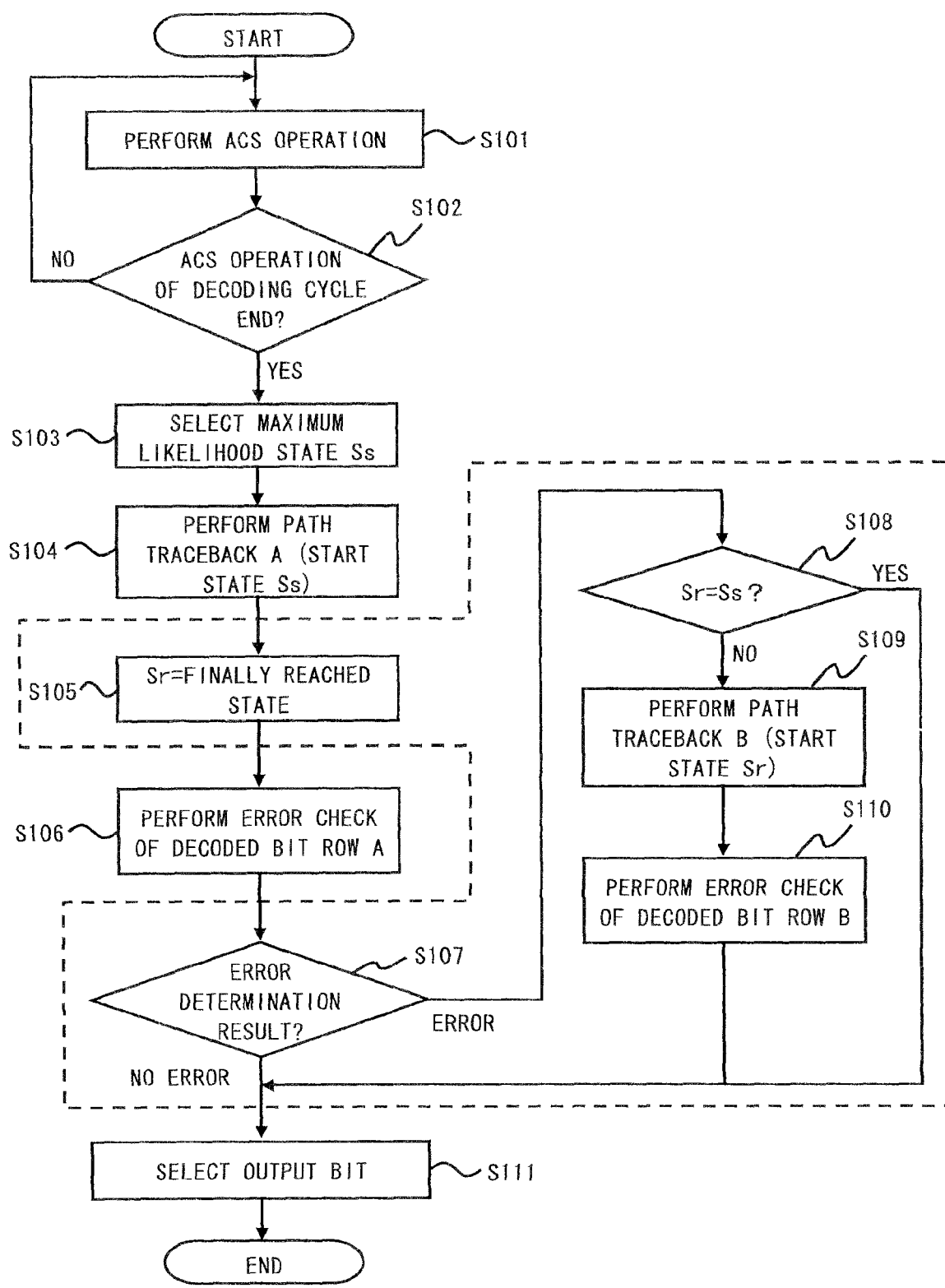
FIG. 10 is a flowchart of a Viterbi decoding method according to a related art.
Figure 11:
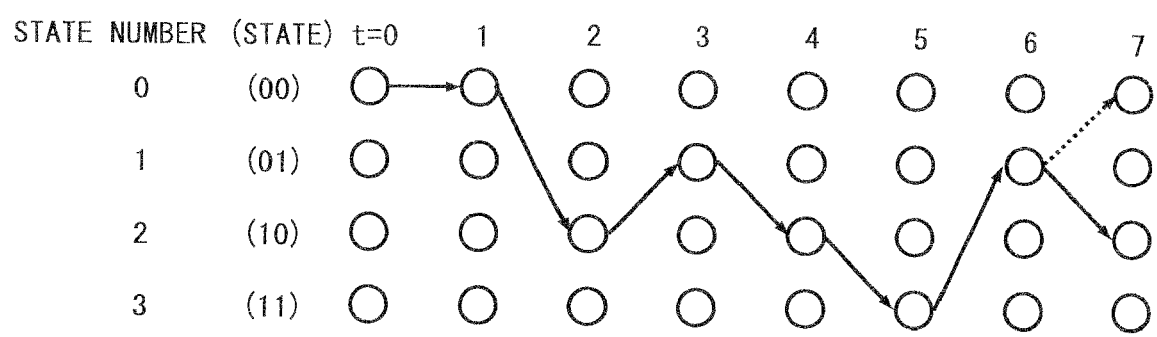
FIG. 11 is a state transition diagram in a Viterbi decoding circuit according to a related art.

The decoding processing in the Viterbi decoding apparatus 1 according to the exemplary embodiment is described hereinafter. FIG. 9 shows a flowchart of the decoding processing in the Viterbi decoding apparatus 1. As shown in FIG. 9, in the decoding processing, the ACS unit 11 first reads input data at a given time point from the input memory 20 (Step S1). Next, the ACS unit 11 performs the ACS operation on the read input data (Step S2). The decoded data obtained by the ACS operation is stored into the internal memory 12. Then, it is determined whether the ACS-operated input data reaches a truncation length (Step S3). The truncation length is decided according to how long the operation result is to be traced back.

If it is determined in Step S3 that the truncation length is not reached (No in Step S3) the process returns to Step S1 and performs the ACS operation on the input data of the next time point. On the other hand, if it is determined in Step S3 that the truncation length is reached (Yes in Step S3), the traceback unit 13 performs the traceback processing and acquires a decoding result (Step S4). The decoding result is stored as decoded data into the output memory 21. Then, it is determined whether all results of one frame (e.g. input data of one cycle stored in the input memory 20) are acquired (Step S5). If it is determined in Step S5 that all results of one frame are not yet acquired (No in Step S5), the process returns to Step S1 and performs the ACS operation on the subsequent input data. On the other hand, if it is determined in Step S5 that all results of one frame are acquired (Yes in Step S5), an error in the decoded data obtained up to Step S5 is checked (Step S6).

It is a basic principle that the ACS operation is performed again if there is an error in the decoded data, and the decoding is terminated if there is no error in the decoded data. However, on the basis of the fact that the error rate of decoded data does not substantially change after the ACS operation is repeated a certain number of times and it is not suitable as the embodiment to endlessly repeat the ACS operation, the exemplary embodiment determines whether to perform the additional ACS operation when there is an error in the decoded data as described below. By the following steps of the exemplary embodiment, it is possible to avoid useless repetition of decoding and thereby shorten a decoding time. Further, it is possible to reduce power consumption of an electronic circuit.

The checking in Step S6 is performed by the error detector 22. Specifically, the error detector 22 compares the first CRC contained in the decoded data and the second CRC calculated from the data row contained in the decoded data to determine whether they match. If the first CRC and the second CRC match, the error detector 22 determines that there is no error in the decoded data and outputs a detection result indicating that the decoded data is correct (Yes in Step S6). On the other hand, if the first CRC and the second CRC do not match, the error detector 22 determines that there is an error in the decoded data and outputs a detection result indicating that there is an error in the decoded data (No in Step S6). Based on the detection result, the decoding controller 15 outputs a control signal indicating the state of a decoding result to the controller 23.

If the determination in Step S6 results in Yes, the decoding controller 15 outputs a control signal indicating that decoding is performed correctly to the controller 23. Then, the controller 23 directs the decoder 10 to end the decoding processing. On the other hand, if the determination in Step S6 results in No, the decoding controller 15 outputs a control signal indicating that decoding is not yet completed to the controller 23. Then, the data comparator 14 compares the decoded data (the second decoded data) of the current cycle (the current lap) with the decoded data (the first decoded data) of the previous cycle (the previous lap) to determine whether they match. The decoding controller 15 refers to the comparison result by the data comparator 14 and determines whether the decoded data is the same between the previous lap and the current lap (Step S7).

If the comparison result in Step S7 indicates match (Yes in Step S7), the decoding controller 15 outputs a control signal indicating that the decoded data does not change even if decoding is continued to the controller 23. In other words, the decoding controller 15 decides to end the decoding Then, the controller 23 directs the decoder 10 to end the decoding processing. On the other hand, if the comparison result in Step S7 indicates no match (No in Step S7), the decoding controller 15 outputs a control signal indicating that decoding is not yet completed to the controller 23. Then, the decoding controller 15 refers to the count value output from the decoding counter 16 and determines whether the number of times of the ACS operation performed on the same input data reaches a specified number (Step S8).

If the count value is equal to or larger than the specified number in Step S8 (Yes in Step S8), the decoding controller 15 outputs a control signal indicating that decoding is completed to the controller 23. In other words, the decoding controller 15 decides to end the decoding. Step 8 is set based on the property of FIG. 8 that is found by the present inventor. Then, the controller 23 directs the decoder 10 to end the decoding processing. On the other hand, if the count value is smaller than the specified number in Step S8 (No in Step S8), the decoding controller 15 outputs a control signal indicating that the ACS operation can be executed again to the controller 23, and increments the count value of the decoding counter 16 by one. Then, the controller 23 directs the decoder 10 to perform the decoding processing again on the received data.

In the case of performing the decoding again, the ACS unit 11 performs the ACS operation again on the received data stored in the input memory 20. At this time, the ACS unit 11 reads the path metric of each state belonging to the final time point of a decoding path out of the path metrics calculated by the previous ACS operation from the internal memory 12. The ACS unit 11 uses the read path metric for the ACS operation of this time. Specifically, the ACS unit 11 performs the ACS operation by setting the path metric of each state that is read from the internal memory 12 as the initial value. The subsequent processing is as described above.

As described in the foregoing, the Viterbi decoding apparatus 1 according to the exemplary embodiment performs decoding additionally on the same input data if an error is contained in decoded data as a result of performing error check using CRC on the decoded data. The Viterbi decoding apparatus 1 can thereby repeatedly perform error correction of encoded data based on the Viterbi decoding algorithm. Thus, the Viterbi decoding apparatus 1 can improve the error correction capability by the repetitive operation.

Further, the Viterbi decoding apparatus 1 ends the decoding processing if the decoded data of the previous lap and the decoded data of the current lap match. In the Viterbi decoding algorithm, if the decoded data does not change in spite of the repetitive operation, no change is likely to occur in the result even if the operation is performed repeatedly after that. Thus, by determining whether to end the decoding processing based on a change in the decoded data, the Viterbi decoding apparatus 1 can increase the processing speed without uselessly repeating the decoding processing.

Furthermore, if there is a constraint on time in the Viterbi decoding, the operation cannot be performed again and again. In light of this, the Viterbi decoding apparatus 1 determines whether to end the processing based on the number of repeated times of the repetitive operation.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

For example, an error detecting code is not limited to CRC and it may be altered as appropriate according to the specification of data or the use of a communication system.

What is claimed is:
1. A decoding apparatus, comprising:
at least one memory;
an add-compare-select (ACS) unit that executes an add-compare-select operation on encoded received data;
an error detector that detects whether there is an error in decoded data calculated based on the executed add-compare-select operation,
the ACS unit configured to, if an error is detected in the decoded data calculated based on the executed add-compare-select operation, additionally execute the add-compare-select operation on the received data using information about the executed add-compare-select operation, and
the error detector configured to detect whether there is an error in the decoded data based on an error detecting code contained in the decoded data;
a decoding controller that determines whether the ACS unit additionally executes the add-compare-select operation on the received data based on a detection result of the error detector; and
a data comparator that compares first decoded data calculated based on the previously executed add-compare-select operation with second decoded data calculated based on the additionally executed add-compare-select operation to determine whether the first decoded data and the second decoded data match,
wherein if the error detector detects an error of the second decoded data and the data comparator determines that the first decoded data and the second decoded data match, the decoding controller decides to end decoding of the received data.

2. The decoding apparatus according to claim 1, wherein if the error detector detects an error of the second decoded data and the data comparator determines that the first decoded data and the second decoded data do not match, the decoding controller determines whether the number of execution times of the add-compare-select operation on the received data is equal to or smaller than a prescribed number.

3. The decoding apparatus according to claim 2, wherein if the number of execution times is equal to or smaller than the prescribed number, the decoding controller decides to further execute the add-compare-select operation on the received data.

4. The decoding apparatus according to claim 2, wherein if the number of execution times is larger than the prescribed number, the decoding controller decides to end decoding of the received data.

5. The decoding apparatus according to claim 1, wherein the information about the add-compare-select operation is a path metric of each state included in a time point in a trellis diagram to which a final state of a decoding path calculated by the add-compare-select operation belongs.

6. The decoding apparatus according to claim 1, wherein the encoding is tail-biting convolutional coding performed at a data transmitting end.

7. The decoding apparatus according to claim 1, wherein the error detecting code is a cyclic redundancy check (CRC) code.

8. A decoding method, comprising:
if there is an error in decoded data calculated based on an add-compare-select operation executed on encoded received data, additionally executing the add-compare-select operation on the received data using information about the executed add-compare-select operation;
if there is an error in second decoded data obtained by additionally executing the add-compare-select operation, comparing first decoded data calculated based on the add-compare-select operation executed before calculating the second decoded data with the additionally-executed add-compare-select operation; and
if the first decoded data and the second decoded data match, deciding to end decoding of the received data.

9. The decoding method according to claim 8, wherein whether there is an error in the decoded data is determined based on an error detecting code contained in the decoded data.

10. The decoding method according to claim 8, further comprising:
if the first decoded data and the second decoded data do not match, determining the number of execution times of the add-compare-select operation on the received data, and
if the number of execution times is larger than a prescribed number, deciding to end decoding of the received data.

* * * * *